(12) United States Patent
Pohl

(10) Patent No.: US 7,663,223 B2
(45) Date of Patent: Feb. 16, 2010

(54) COUPLING SUBSTRATE FOR SEMICONDUCTOR COMPONENTS AND METHOD FOR PRODUCING THE SAME

(75) Inventor: Jens Pohl, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 145 days.

(21) Appl. No.: 11/522,518

(22) Filed: Sep. 18, 2006

(65) Prior Publication Data
US 2007/0102807 A1 May 10, 2007

Related U.S. Application Data

(63) Continuation of application No. PCT/DE2005/000468, filed on Mar. 15, 2005.

(30) Foreign Application Priority Data
Mar. 16, 2004 (DE) .............. 10 2004 012 979

(51) Int. Cl.
*H01L 23/495* (2006.01)
*H01L 23/538* (2006.01)

(52) U.S. Cl. .............. 257/696; 257/668; 257/E23.048; 257/E23.17

(58) Field of Classification Search ........... 257/666, 257/668, 690, 692, 693, 696, E23.047, E23.048, 257/E23.169, E23.178
See application file for complete search history.

(56) References Cited

U.S. PATENT DOCUMENTS

| | | | |
|---|---|---|---|
| 4,870,476 A * | 9/1989 | Solstad ............... 257/668 |
| 4,953,005 A | 8/1990 | Carlson et al. | |
| 5,346,402 A | 9/1994 | Yasuho et al. | |
| 5,381,039 A | 1/1995 | Morrison | |
| 6,084,780 A | 7/2000 | Happoya | |
| 6,359,236 B1 | 3/2002 | DiStefano et al. | |
| 6,452,257 B2 * | 9/2002 | Hashimoto ............... 257/668 |
| 6,509,630 B1 | 1/2003 | Yanagisawa | |
| 6,545,868 B1 | 4/2003 | Kledzik et al. | |
| 6,593,648 B2 * | 7/2003 | Emoto ............... 257/696 |
| 6,664,136 B2 * | 12/2003 | Motonami et al. ....... 438/123 |
| 2001/0001217 A1 * | 5/2001 | Ohuchi et al. ............ 257/773 |
| 2002/0105068 A1 | 8/2002 | Fukumoto et al. | |
| 2002/0131258 A1 | 9/2002 | Inoue et al. | |
| 2003/0020154 A1 | 1/2003 | Hashimoto | |
| 2003/0030143 A1 * | 2/2003 | Wennemuth et al. ...... 257/738 |
| 2003/0111736 A1 | 6/2003 | Roeters et al. | |
| 2003/0221313 A1 | 12/2003 | Gann | |

* cited by examiner

*Primary Examiner*—Marcos D. Pizarro
(74) *Attorney, Agent, or Firm*—Edell, Shapiro & Finnan, LLC

(57) ABSTRACT

A coupling substrate for semiconductor components includes a patterned metal layer on a topside of an insulating carrier. Metal tracks project beyond the insulating carrier, the metal tracks being angled away at the lateral edges of the carrier in the direction of the underside of the carrier and projecting beyond the underside of the carrier. The metal tracks have a metal coating, thereby enlarging each cross section such that the metal tracks form dimensionally stable, flat, conductor external contacts of the coupling substrate.

14 Claims, 9 Drawing Sheets

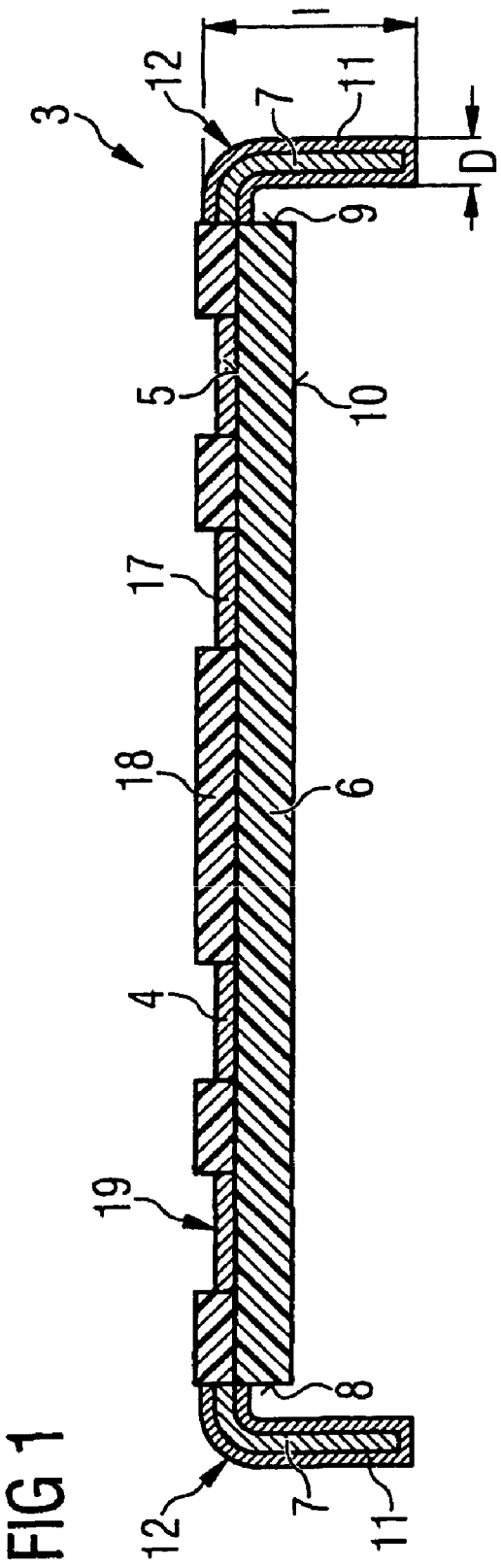

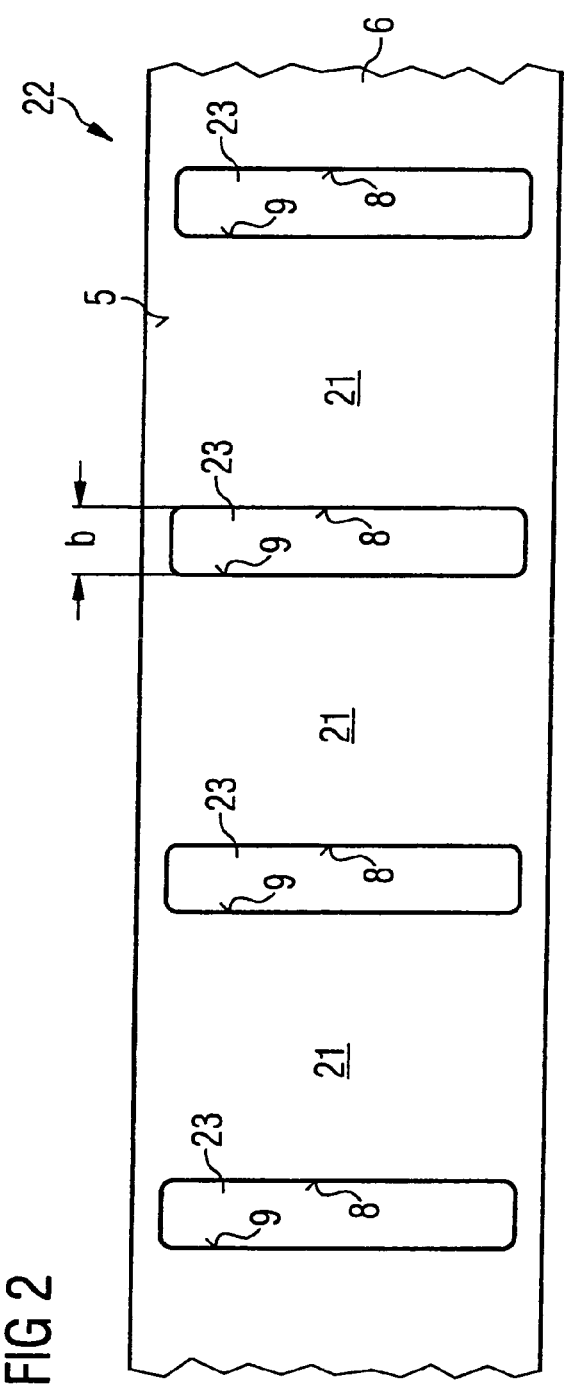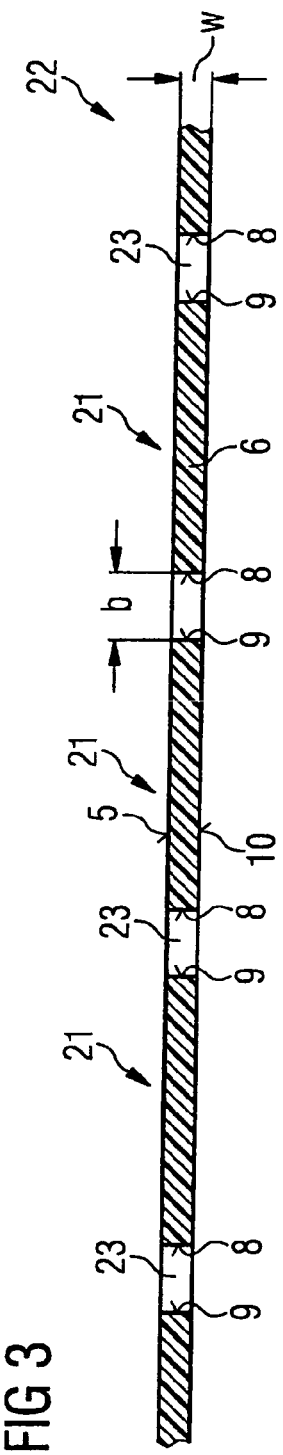

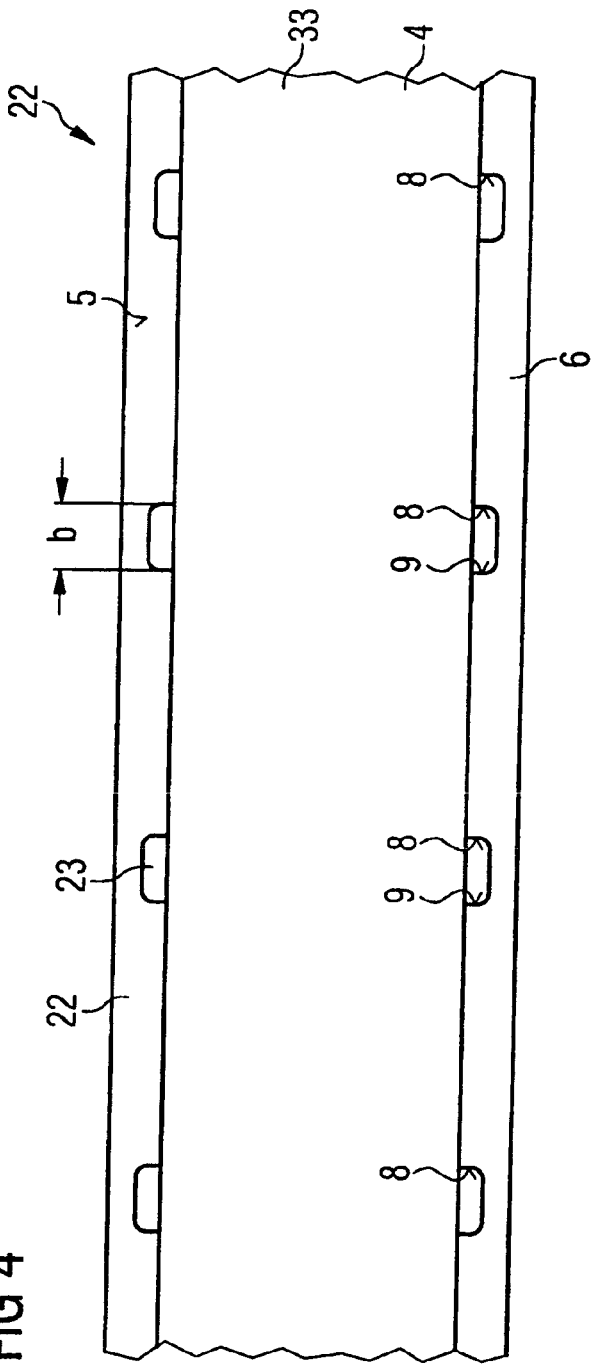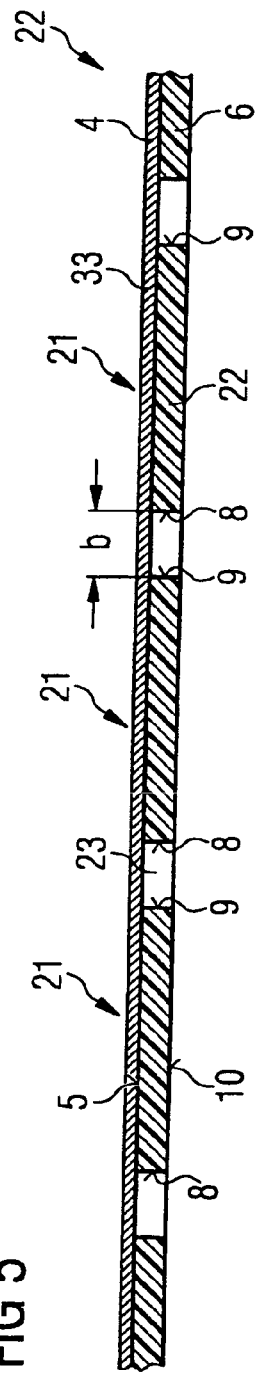

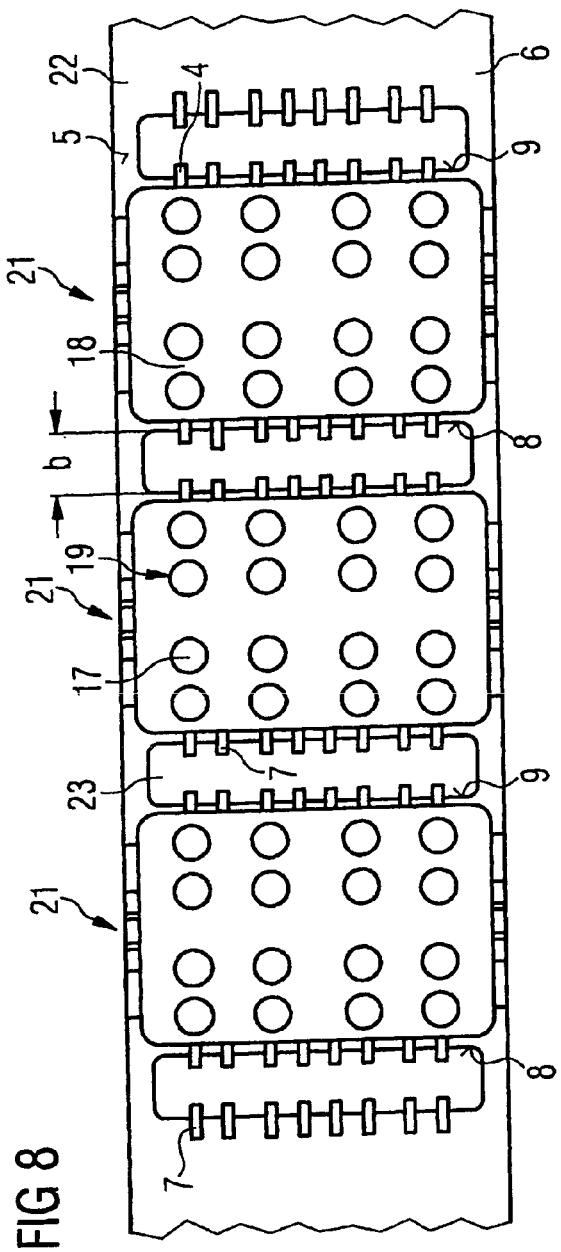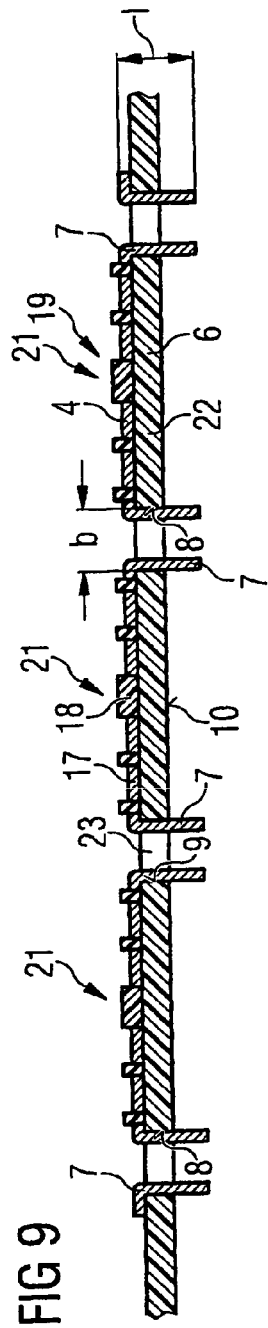
FIG 8
FIG 9

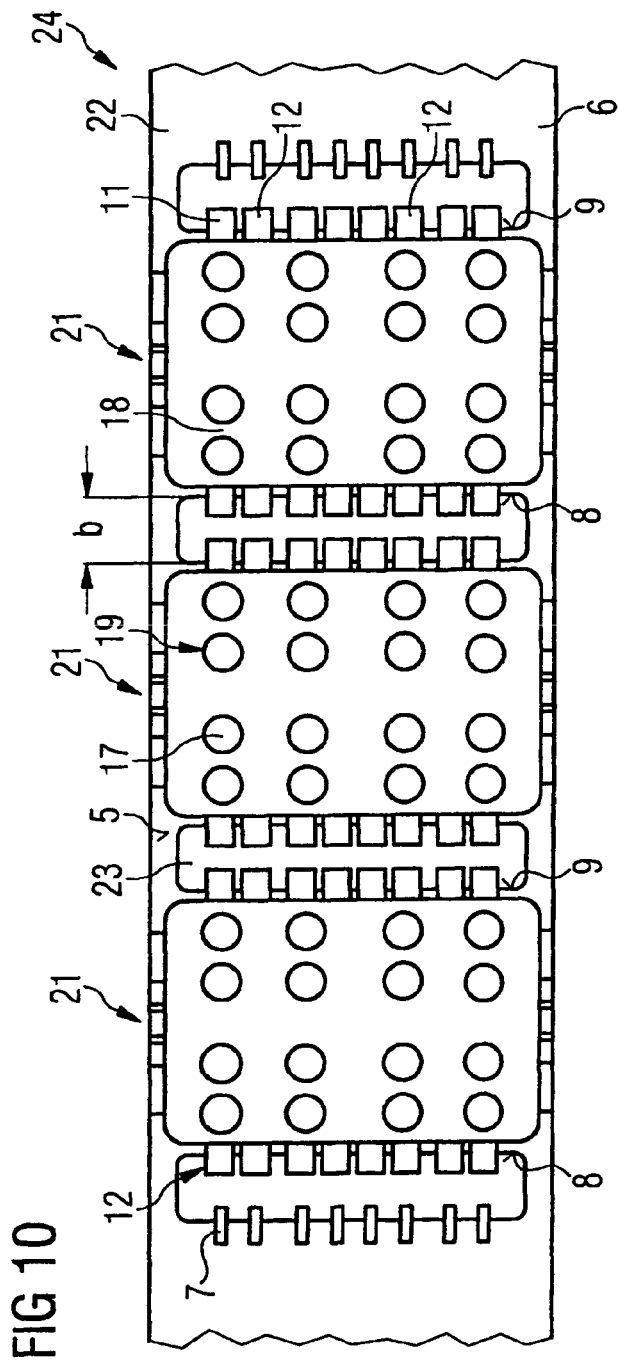
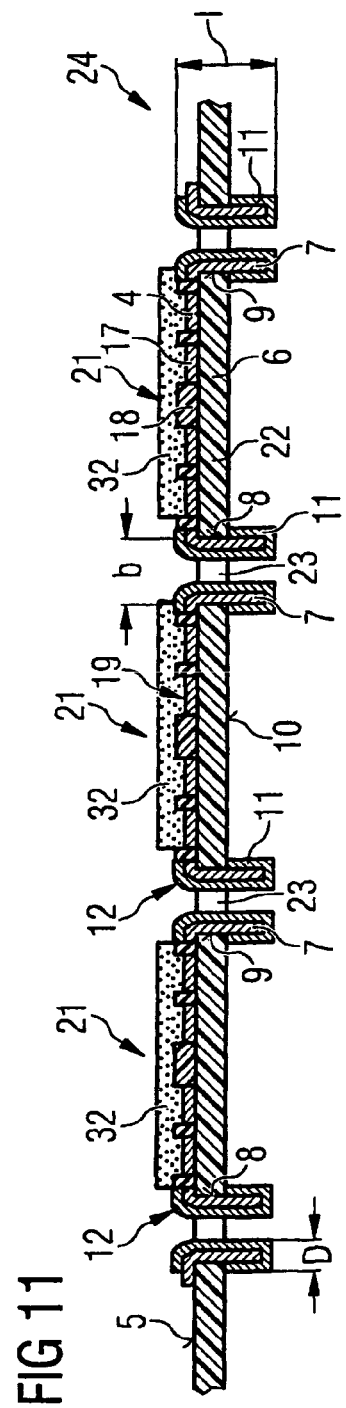
FIG 10
FIG 11

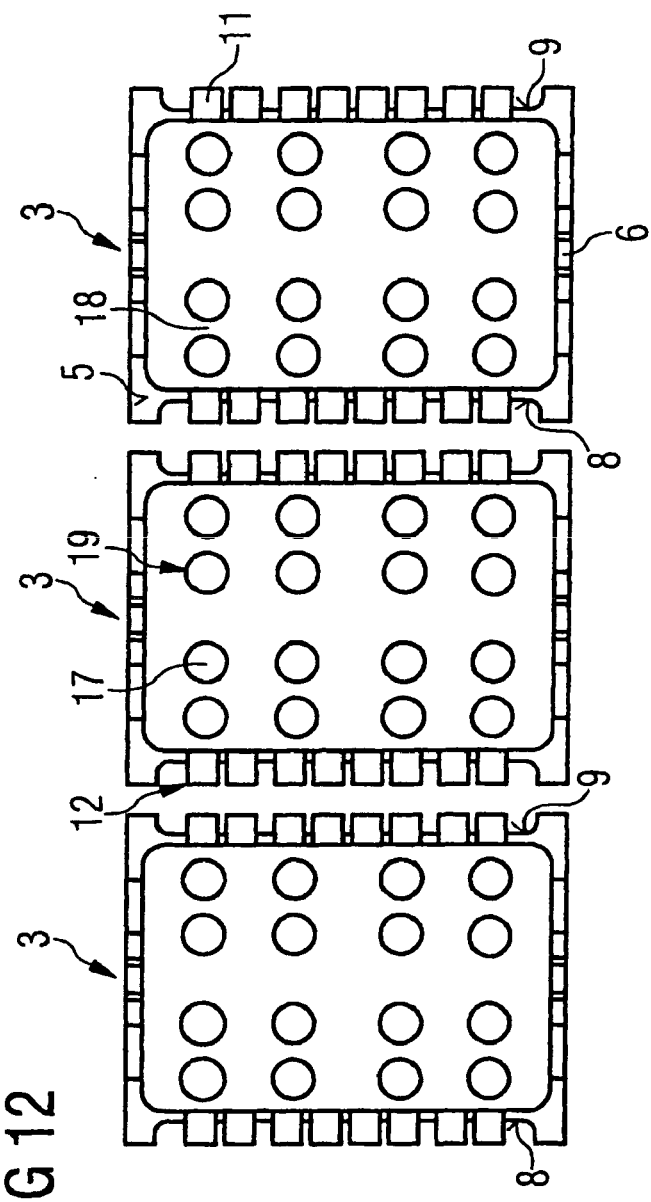
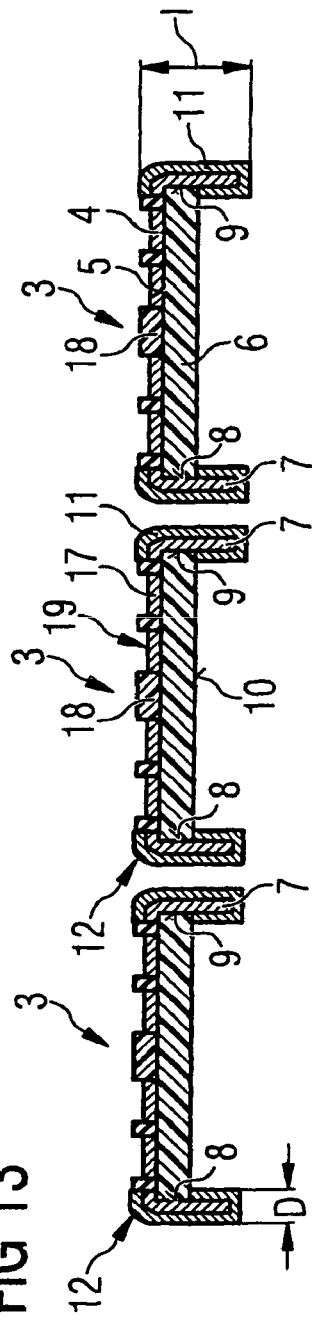

COUPLING SUBSTRATE FOR SEMICONDUCTOR COMPONENTS AND METHOD FOR PRODUCING THE SAME

CROSS REFERENCE TO RELATED APPLICATIONS

This application is a continuation of International Application No. PCT/DE 2005/000468, filed on Mar. 15, 2005, entitled "Coupling Substrate for Semiconductor Components and Method for the Production Thereof," which claims priority under 35 U.S.C. §119 to Application No. DE 102004012979.7 filed on Mar. 16, 2004, entitled "Coupling Substrate for Semiconductor Components and Method for the Production Thereof," the entire contents of which are hereby incorporated by reference.

FIELD OF THE INVENTION

The claimed device relates to a coupling substrate for semiconductor components including a patterned metal layer on a topside of an insulating carrier and a method for the producing the same.

BACKGROUND

Coupling substrates or intermediate substrates are also called "interposers" and can connect semiconductor components or semiconductor chips stacked one above another. These "interposers" are based in part on a flat conductor leadframe which accommodates a plurality of coupling substrates arranged in strips and provides a metal cross section which imparts to the flat conductor leadframe a sufficient stability for a self-supporting structure. The semiconductor chips are fixed to the flat conductor leadframe via bonding wires or flip-chip contacts, which leads to failures, particularly when such semiconductor components are packed to form semiconductor stacks or semiconductor modules.

If the semiconductor components to be stacked are based on a flat conductor construction of this type, or on a construction with a rewiring substrate, then the central regions are occupied by semiconductor chips and the stacked components can be interconnected only via the edge regions of the components to be stacked. Consequently, the arrangement pattern for external contacts, at least of the upper semiconductor component, is constructionally restricted to the edge regions.

Other solutions, such as are known for example from the document DE 101 38 278, propose using flexible films as "interposers." These have the disadvantage that they have to be areally fixed with a film area on the semiconductor component or the semiconductor chip and are bent semicircularly toward the nearest neighbor in a stack, which increases the risk of a connection interruption caused by microcracks. At the very least this does not result in a stable stack construction, which adversely affects the reliability of the semiconductor module.

SUMMARY

A coupling substrate for semiconductor components includes a patterned metal layer on a topside of an insulating carrier. Metal tracks project beyond the insulating carrier, the metal tracks being angled away at the lateral edges of the carrier in the direction of the underside of the carrier and projecting beyond the underside of the carrier. The metal tracks have a metal coating, thereby enlarging each cross section such that the metal tracks form dimensionally stable, flat, conductor external contacts of the coupling substrate.

The above and still further features and advantages will become apparent upon consideration of the following definitions, descriptions and descriptive figures of specific embodiments thereof, wherein like reference numerals in the various figures are utilized to designate like components. While these descriptions go into specific details, it should be understood that variations may and do exist and would be apparent to those skilled in the art based on the descriptions herein.

BRIEF DESCRIPTION OF THE DRAWINGS

The invention is explained in more detail below with reference to exemplary embodiments, where:

FIG. 1 shows a schematic cross section through a coupling substrate of one embodiment of the invention;

FIG. 2 shows a schematic plan view of a carrier strip;

FIG. 3 shows a schematic cross-sectional view of the carrier strip from FIG. 2;

FIG. 4 shows a schematic plan view of the carrier strip from FIG. 1 with an applied metal film;

FIG. 5 shows a schematic cross section of the carrier strip from FIG. 4;

FIG. 8 shows a schematic plan view of the carrier strip from FIG. 6 with a covered metal structure;

FIG. 9 shows a schematic cross section through the carrier strip in accordance with FIG. 8;

FIG. 10 shows a schematic plan view of the carrier strip from FIG. 8 with reinforced dimensionally stable flat conductor external contacts and a protected rewiring structure;

FIG. 11 shows a schematic cross section through the carrier strip in accordance with FIG. 10;

FIG. 12 shows a schematic plan view of the carrier strip after the latter has been separated into individual coupling substrates;

FIG. 13 shows a schematic cross section through three individual coupling substrates in accordance with FIG. 12;

DETAILED DESCRIPTION

Figure 6:
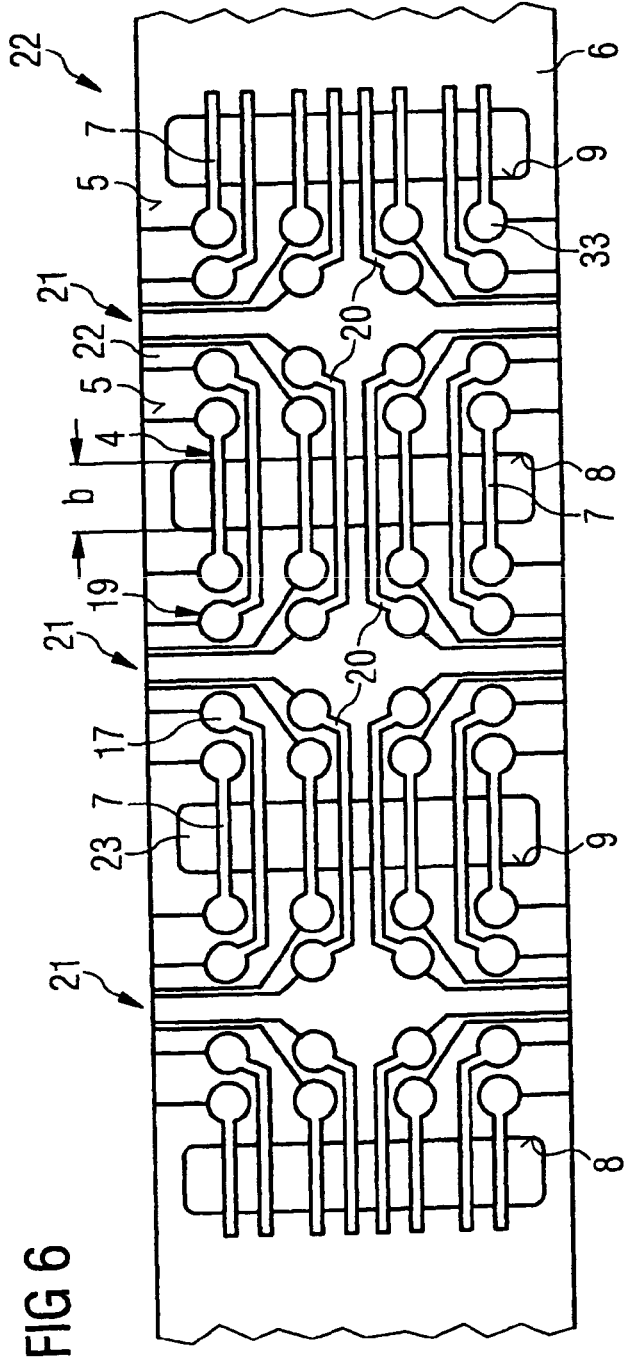
FIG. 6 shows a schematic plan view of the carrier strip from FIG. 4 with patterned metal film.

A coupling substrate and a method for the production thereof overcomes the disadvantages in the prior art and enables stacking of semiconductor components with different arrangement patterns of the external contacts of the semiconductor components to be stacked. Furthermore, this approach minimizes the space requirement and the area requirement of a semiconductor module.

The described system provides a coupling substrate for semiconductor components, which includes a patterned metal layer on a topside of an insulating carrier. The patterned metal layer includes metal tracks which project beyond the lateral edges of the carrier and are angled away at right angles to the topside in the direction of the underside of the carrier. In this case, the metal tracks may project beyond the underside. The metal tracks projecting beyond the lateral edges of the carrier comprise a metal coating, with which a thickness of the cross section is achieved such that the metal tracks form dimensionally stable flat conductor external contacts of the coupling substrate. The coupling substrate is connected via the dimensionally stable flat conductor external contacts to a semiconductor component arranged below the coupling substrate and within the flat conductor external contacts.

A coupling substrate of this type has the advantage that the semiconductor component beneath the coupling substrate may have any desired arrangement pattern of its external contacts and may be applied to a circuit substrate independent of the coupling substrate. The circuit substrate may belong to a superordinate printed circuit board or may constitute a rewiring plate of the semiconductor component to be connected to the coupling substrate. Moreover, the coupling substrate has the advantage that the patterned metal layer on the topside of the insulating carrier can be configured as desired and may thus have an arrangement pattern for external contact areas which are adapted to an arrangement pattern of external contacts of a semiconductor component to be stacked.

In one exemplary embodiment, the flat conductor external contacts of the coupling substrate and the semiconductor component are arranged on a topside of the wiring substrate. The flat conductor external contacts of the coupling substrate and of the semiconductor component arranged beneath the coupling substrate are electrically connected to one another via the wiring substrate. This has the advantage that the coupling substrate in conjunction with the semiconductor component and the wiring substrate can form a semiconductor base component for a semiconductor stack. This semiconductor base component can be used universally, especially as the arrangement pattern afforded by the patterned metal layer of the coupling substrate can be adapted to different semiconductor components to be stacked.

In a further embodiment, the semiconductor component is not arranged beneath the coupling substrate; rather a wiring structure is fitted on the underside of the insulating carrier, which wiring structure, for its part, connects a semiconductor chip to the coupling substrate. In conjunction with the semiconductor chip, the coupling substrate now constitutes a semiconductor base component which can be used independently of an additional wiring substrate for a stack of semiconductor components. In this case, it is advantageous if the semiconductor component is a semiconductor chip that is electrically connected by flip-chip contacts to the wiring structure on the underside of the insulating carrier. In this case, a very compact semiconductor base component minimized in terms of its space requirement is created with the coupling substrate.

Furthermore, the semiconductor component arranged below the coupling substrate may have a semiconductor component having surface-mountable external contacts. Surface-mountable external contacts of this type may comprise a solder layer with which the semiconductor component is arranged either onto a wiring structure on the underside of the insulating carrier or on a wiring structure of a superordinate circuit carrier.

In a further embodiment, the coupling substrate has external contact areas on its topside, the external contact areas being surrounded by a soldering resist layer and including an arrangement pattern for external contacts of a semiconductor component to be stacked. The soldering resist layer advantageously ensures that during a soldering operation for example when fitting a semiconductor component to be stacked on the topside of the coupling substrate, the patterned metal layer is wetted with soldering material only in the region of the external contact areas and no solder gets onto the rest of the metal structure.

It is furthermore provided that the flat conductor external contacts of the coupling substrate comprising reinforced metal tracks are electrically connected to the external contact areas on the topside of the coupling substrate via conductor tracks of the patterned metal layer. This embodiment has the advantage that only the metal tracks which project beyond the lateral edges of the carrier are reinforced with a metal layer and, on the topside of the coupling substrate, merge into conductor tracks corresponding to the patterned metal layer in terms of their thickness.

A further aspect relates to a coupling substrate strip comprising coupling substrate positions arranged in rows and/or columns. The coupling substrate strip has a patterned metal layer on a topside of an insulating carrier strip. From the patterned metal layer, metal tracks partly extend via passage openings in lateral regions of the coupling substrate positions and are angled away at right angles to the topside of the carrier strip in the direction of the underside of the carrier strip. The metal tracks include a metal coating and form with the metal coating a thickness of their cross section such that they are dimensionally stable flat conductor external contacts of the coupling substrate strip at the lateral edges of the coupling substrate positions.

The coupling substrate strip comprises, on its topside, external contact areas which are surrounded by a soldering resist layer and form an arrangement pattern for external contacts of semiconductor components to be stacked. The flat conductor external contacts of the coupling substrate strip are connected via conductor tracks of the patterned metal layer to the external contact areas on the topside of the coupling substrate strip. A coupling substrate strip of this type can be separated to form coupling substrates by separating the coupling substrate strip into individual coupling substrates along the rows and/or along the columns.

Prior to separation, the coupling substrate strip may furthermore also be provided with a rewiring structure on its underside, so that semiconductor chips with flip-chip contacts or other surface-mountable semiconductor components can be directly connected to a wiring structure on the underside of the coupling substrate strip. Separation of the coupling substrate strip then gives rise to already complete semiconductor components, or semiconductor base components, which can be used for a semiconductor component stack.

A further aspect provides a semiconductor module comprising a semiconductor base component, which includes a wiring substrate with external contacts of the semiconductor module on its underside and with a wiring structure with a semiconductor chip on its topside and with contact pads on edge regions of the topside of the wiring substrate. A coupling substrate is connected by its flat conductor external contacts on the contact pads in the edge regions, the coupling substrate having external contact areas for a stacked semiconductor component on its topside. A semiconductor module of this type has the advantage that as many semiconductor components as desired can be stacked one on top of another with the aid of the coupling substrate, in which case a further coupling substrate is to be arranged above each semiconductor component if further semiconductor components are intended to be added to the stack.

The basis of a semiconductor module of this type is a semiconductor base component comprising a coupling substrate, the coupling substrate including external contact areas for a semiconductor component to be stacked on its topside. On its underside, the coupling substrate may also carry a wiring structure, which, for its part, is electrically connected to a semiconductor chip and is electrically connected to the external contact areas on the topside of the coupling substrate via through contacts and wiring lines. In its lateral edges, the semiconductor base component provides the flat conductor external contacts already mentioned above, which, through thickening of metal tracks projecting beyond the edge of the coupling substrate, form a cross section which dimensionally stably reinforces the flat conductor external contacts.

A method for the production of a coupling substrate strip having a plurality of coupling substrate positions comprises the following processes. The first process involves producing an insulating carrier strip with a plurality of coupling substrate positions. Passage openings are subsequently introduced into the carrier strip in edge regions of the coupling substrate positions. In this case, the width of the passage openings corresponds to at least double the length of the flat conductor external contacts to be formed. A closed metal layer is subsequently applied to the carrier strip, the metal layer simultaneously covering the width of the passage openings. The metal layer is subsequently patterned with the formation in the process of external contact areas on the topside of the insulating carrier strip and metal tracks which span the width of the passage openings.

In the center of the passage openings, the metal tracks are either separated or include a desired breaking point. Moreover, the metal layer is patterned in such a way that conductor tracks on the topside of the insulating carrier strip electrically connect the metal tracks to the external contact areas. The metal tracks are combined via short-circuit conductor track segments to form a bus line of the carrier strip. The metal tracks are subsequently angled away in the passage openings in the direction of the underside of the carrier strip. The metal structure of the topside of the carrier strip is then covered with a protective layer without exposing the metal tracks.

During the subsequent galvanic step, the protective layer is intended to protect the metal structure on the topside of the carrier strip against deposition of metal and thickening of the structure, while metal tracks are provided with a metal coating with the formation of dimensionally stable flat conductor external contacts. In a subsequent step, the protective layer is initially removed only for uncovering the short-circuit conductor track segments, and the short-circuit conductor track segments are interrupted via an etching technology or via a laser technology. The external contact areas under the protective layer may subsequently be uncovered, so that the protective layer may serve as a soldering resist layer, while free access to the external contact areas is possible. This method has the advantage that a plurality of coupling substrates arises on an insulating carrier strip which can subsequently be separated into individual coupling substrates.

In detail, various technologies are used for the various processes. A stamping technology or an etching technology is provided for introducing the passage opening into the carrier strip. The process of applying a metal layer to the carrier strip may be carried out via an adhesively bonding on a metal film. The process of patterning the metal layer is then carried out via a photo resist technology in conjunction with etching technologies or a removal technology via a laser beam. With the use of photolithography, the patterned photo resist of the patterning step may simultaneously be used as a soldering resist. The process of angling away the metal tracks before or else after thickening to form flat conductor external contacts may be effected via edging tools.

The process of applying a metal coating to the metal tracks is effected by dipping the carrier strip into an electroplating bath and the metal tracks are connected to a DC electrode of the electroplating bath via the short-circuit conductor track segments. For this purpose, the metal tracks are connected as cathode, so that the material of the metallic anode of the electroplating bath deposits as a coating on the metal tracks, while the rest of the metal structure is protected against such a coating by the protective layer. Prior to removing the protective layer, initially only the short-circuit conductor track segments are uncovered and removed by etching technology, while the rest of the structure on the topside of the carrier strip continues to be covered by the protective layer. It is only after the removal of the short-circuit conductor track segments that the external contact areas on the topside of the carrier strip are then uncovered as well, so that the finished coupling substrate strip is now available for the production of coupling substrates.

For the production of a coupling substrate, the coupling substrate strip is separated along the rows and/or the columns to form individual coupling substrates.

Coupling substrates of this type can be used to produce a semiconductor base component for a stack of semiconductor components. The following method steps are carried out for the production of a semiconductor base component. The first step involves also producing, in parallel with the production of a coupling substrate, a wiring substrate with a semiconductor chip on its topside and contact pads on edge regions of its topside, and also external contact areas with external contacts on its underside. The coupling substrate is subsequently applied to the wiring substrate without soldering the flat conductor external contacts of the coupling substrate onto corresponding contact pads in the edge regions of the wiring substrate. Since the coupling substrate has on its topside external contact areas which enable further semiconductor components to be stacked, a semiconductor base component is thus created on which it is possible to stack semiconductor components with correspondingly adapted arrangement patterns of the external contacts. For the production of a semiconductor module, it is then merely necessary for corresponding further semiconductor components to be applied by their external contacts to a semiconductor base component of this type.

To summarize, it can be stated that the coupling substrate allows arrangement above a semiconductor component of arbitrary design a further semiconductor component with an arbitrary standardized arrangement of its surface-mountable external contacts, such as a DRAM component, for example. For this purpose, an "interposer" is provided which can be produced comparatively inexpensively, especially at it requires no plated-through holes whatsoever in its basic version. The production of dimensionally stable flat conductor external contacts is achieved for the "interposer", or the coupling substrate, using relatively cost-effective deposition methods.

With these flat conductor external contacts produced by metal coating of metal tracks of a metal layer, it is possible to achieve a reduction in the pitch between the external contacts compared with what is possible in the case of a stack connection via solder balls. Moreover, the line lengths are shorter in comparison with the solution with flexible films as mentioned in the introduction, which improves the electrical parameters with regard to radiofrequency properties or high-speed switching rates in the gigahertz range.

Exemplary embodiments are now described in connection with the figures. FIG. 1 shows a schematic cross section through a coupling substrate 3 of one embodiment. The coupling substrate 3 has a carrier 6 having an underside 10 and a topside 5. A patterned metal layer 4 having an arrangement pattern 19 of external contact areas 17 is arranged on the topside 5 of the carrier 6. The external contact areas 17 are connected to strip-type metal tracks 7 angled away in the direction of the underside 10 via conductor tracks on the topside 5 of the carrier 6. In this figure and the subsequent figures, a distinction is made between metal tracks 7 which project beyond lateral edges 8 and 9 of the carrier 6 and are angled away in the direction of the underside 10, and the conductor tracks arranged on the topside 5 for connecting the metal tracks 7 to the external contact areas 17. The thickness of the metal tracks 7 and the thickness of the conductor tracks correspond to the thickness of the metal layer 4 for the external contact areas 17, especially as they are patterned jointly from the metal layer 4. The thickness of the metal layer 4 would be too small, however, to form dimensionally stable flat conductor external contacts 12 from the metal tracks 7. Therefore, the angled-away metal tracks 7 are provided with a metal coating 11, so that they have a thickness D of between 100 and 1000 μm. The carrier 6 itself is made from an insulating plastic and forms a dimensionally stable self-supporting plate. As used herein, the term "dimensionally stable" is understood to mean that the metal coating 11 provides a rigid structure to the metal tracks such that the newly formed flat conductor external contacts 12 are capable of supporting the weight of the coupling substrate and any added weight of stacked components without the external contacts 12 substantially deforming.

A soldering resist layer 18 is arranged between the external contact areas 17 on the topside 5 of the carrier 6, the soldering resist layer covering the entire surface 5 and leaving only the external contact areas 17 exposed, such that, e.g., a semiconductor component to be stacked can be applied on the external contact areas 17 by its surface-mountable external contacts.

FIGS. 2 to 13 show basic schematic diagrams of intermediate products in the production of a coupling substrate 3. Components having the same functions as in FIG. 1 are identified by the same reference symbols in FIGS. 2 to 13 and are not discussed separately.

FIG. 2 shows a schematic plan view of a carrier strip 22. The carrier strip 22 has a plurality of coupling substrate positions 21 in which coupling substrates are formed on the carrier strip 22 with the aid of the following method procedures. Between the coupling substrate positions 21, the carrier strip 22 has elongated passage openings 23 having lateral edges 8 and 9. Between the lateral edges 8 and 9 a width b of the passage openings 23 arises which has at least double the length 1 of a flat conductor external contact 12 to be formed, such as is shown in FIG. 1.

FIG. 3 shows a schematic cross section of the carrier strip 22 in accordance with FIG. 2. The thickness w of the carrier strip 22 lies between 80 and 200 μm and is made from a plastic material with embedded glass fibers which impart a dimensional stability to the carrier strip 22. The passage openings 23 are introduced into the carrier strip 22 via a stamping tool or via a laser beam or water jet cutting method.

FIG. 4 shows a schematic plan view of the carrier strip 22 from FIG. 2 with an applied metal film 33, preferably made of copper or a copper alloy. The metal film 33 is adhesively bonded onto the carrier strip 22 and in this case it extends over the passage openings 23 of the carrier 6.

FIG. 5 shows a schematic cross section of the carrier strip 22 from FIG. 4. This structure with a carrier strip 22 having passage openings 23 covered by a metal film 33 may also be achieved by providing a metal-clad carrier strip 22 already having a metal layer, the passage openings 23 in the carrier strip 22 being achieved by removing the carrier material in the passage openings 23. This removal may be achieved by laser removal or by dry or wet etchings. In this case, the metal covering 33 that covers the passage openings 23 is not removed or damaged.

FIG. 6 shows a schematic plan view of the carrier strip 22 from FIG. 4 with a patterned metal film 33. If a copper-clad carrier strip 22 is used instead of a metal film 33, then this copper cladding as metal layer 4 can also be patterned in the same way as the metal film 33 used here. What is characteristic of the patterning is that the metal structure made from a copper layer, for example, has external contact areas 17 which can accommodate a solder ball, for example, and has conductor tracks 20 arranged on the topside 5 of the carrier strip 22.

After the patterning, metal tracks 7 extend over the passage openings 23, the metal tracks initially being just as thin as the metal film 33 or the metal layer 4. The cross section of the metal tracks 7 extending over the passage opening 23 can be reduced in the center by notching, however, so that a desired breaking point arises there. In the course of angling away the metal tracks 7 over the passage openings 23 in the direction of the underside 10 of the carrier strip 22, the metal tracks are separated centrally at the desired breaking point to form angled-away metal tracks 7.

Figure 7:
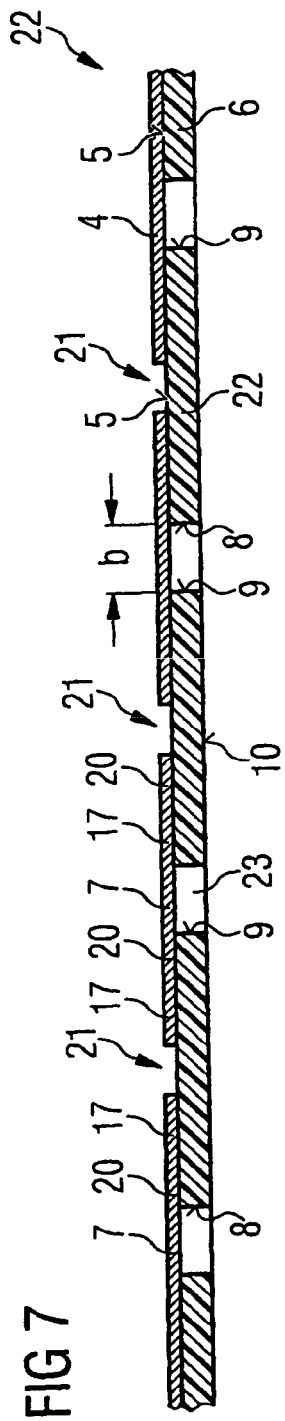
FIG. 7 shows a schematic cross section of the carrier strip from FIG. 6.

FIG. 7 shows a schematic cross section of the carrier strip 22 from FIG. 6. Since the metal layer 4 has been patterned in the meantime, it is no longer positioned continuously over the entire surface 5 of the carrier strip 22 as in FIG. 5, but rather is present only at the locations at which conductor tracks 20 or external contact areas 17 are provided.

FIG. 8 shows a schematic plan view of the carrier strip 22 from FIG. 6 with a covered metal structure 4 and angled-away metal tracks 7. The width of the metal tracks 7 can be chosen to be small, so that a smaller pitch is possible for the metal tracks 7 than the pitch of the external contact areas 17 provided for external contacts. The coupling substrate positions 21 are covered with a patterned soldering resist layer 18 which leaves access free to the external contact areas 17. The soldering resist layer 18 protects the conductor tracks 20 shown in FIG. 7 against wetting by soldering material.

FIG. 9 shows a schematic cross section through the carrier strip 22 in accordance with FIG. 8. The cross section through the carrier strip 22 shows that the angled-away metal tracks 7 bear closely on the lateral edges 8 and 9 of the passage openings 23 of the carrier strip 22. Since the patterned metal layer 4 having a thickness of 2 to 15 μm is relatively unstable, the angled-away metal tracks 7 are supported by the lateral edges 8 and 9 of the carrier strip 22. However, they do not yet form a self-supporting and dimensionally stable flat conductor external contact.

FIG. 10 shows a schematic plan view of the carrier strip 22 from FIG. 8 with reinforced dimensionally stable flat conductor external contacts 12. During the thickening of the metal tracks to form dimensionally stable flat conductor external contacts 12, the patterned metal layer 4 is protected by a protective layer 32—shown in FIG. 11—on the patterned metal layer 4. Since the metal tracks 7 to be thickened have already been separated, short-circuit conductor track segments are provided on the topside 5 of the carrier strip 22, the segments being etched away again at a later point in time. The short-circuit conductor track segments electrically connect all of the metal tracks 7 of a carrier strip 22 and can be jointly connected to a cathode of an electroplating bath, so that the anode material deposits on the metal tracks 7. After the deposition process, the short-circuit conductor track segments have to be removed, which requires an additional photolithographic step or else an additional removal step by means of a laser.

In an alternative method, that can be avoided by the edging and separation of the metal tracks 7 that extend over the passage openings 23 of the carrier strip 22 not being performed until when the regions of the metal tracks 7 have already been reinforced by electrodeposition in comparison with the normal conductor tracks of the metal structure. In this case, the provision of short-circuit conductor tracks on the topside 5 of the carrier strip 22 between the metal tracks is obviated since the latter are still joined together. However, short-circuit conductor tracks are then required between the external contact areas 17 and have to be removed later.

FIG. 11 shows a schematic cross section through the carrier strip 22 in accordance with FIG. 10. As a result of the deposition of the metal coating 11 on the angled-away metal tracks 7 with the metal structure 4 simultaneously being protected by the protective layer 32 on the topside 5 of the carrier strip 22, the metal tracks 7 are reinforced in such a way that they form dimensionally stable flat conductor external contacts 12 having a length 1.

FIG. 12 shows a schematic plan view of the carrier strip 22 from FIG. 10 after the carrier strip has been separated into individual coupling substrates 3.

FIG. 13 shows a schematic cross section through three individual coupling substrates 3 in accordance with FIG. 12. With this coupling substrate 3 it is now possible to assemble any desired stacks comprising different semiconductor components, it being necessary for a coupling substrate 3 of this type to be provided in each case between the semiconductor components.

Figure 14:
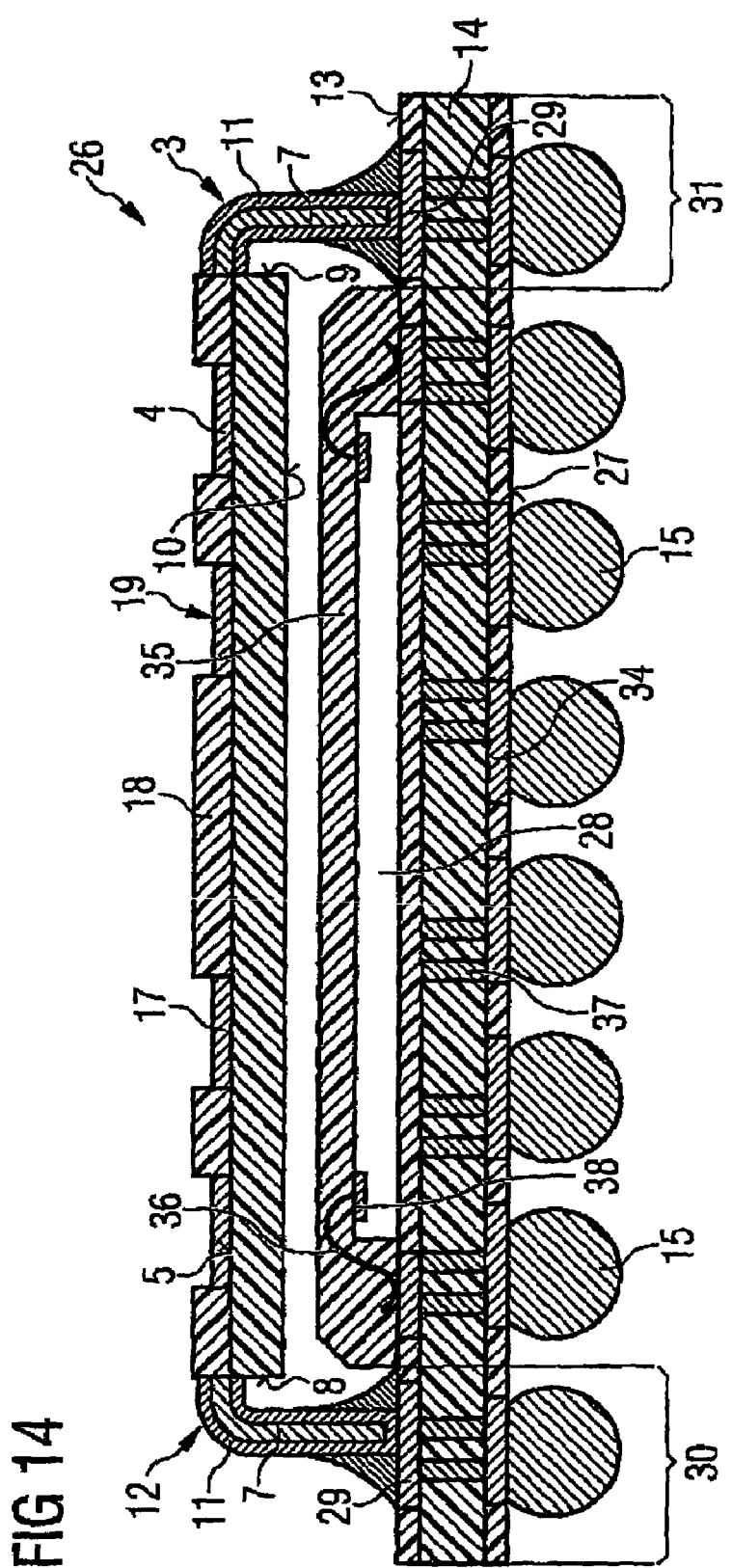
FIG. 14 shows a schematic cross section through a semiconductor base component for a semiconductor stack with a coupling substrate.

FIG. 14 shows a schematic cross section through a semiconductor base component 26 for a semiconductor stack with a coupling substrate 3. Here the coupling substrate 3 forms the topside of the semiconductor base component 26 and has the same structure that has already been shown in FIG. 1. The semiconductor base component 26 furthermore has a wiring substrate 14 having a topside 13 having contact pads 29 in edge regions 30 and 31. The coupling substrate 3 is soldered onto the contact pads 29 by its flat conductor external contacts 12. A semiconductor chip 28 embedded in a plastic composition 35 is arranged below the coupling substrate 3 in the case of this semiconductor base component 26. The semiconductor chip may also be a semiconductor chip using flip-chip technology with and without surrounding plastics composition. The semiconductor chip 28 is electrically connected to the wiring substrate 14 via bonding connections 36.

External contacts 15 on external contact areas 34 in the form of solder balls are arranged on the underside 27 of the wiring substrate 14. The external contacts 15 are electrically connected via through contacts 37 both to the contact areas 38 of the semiconductor chip 28 and to the flat conductor external contacts 12 of the coupling substrate 3. On account of the coupling substrate 3, surface-mountable semiconductor components with different arrangement patterns of their external contacts can be arranged onto the semiconductor base component 26.

Figure 15:
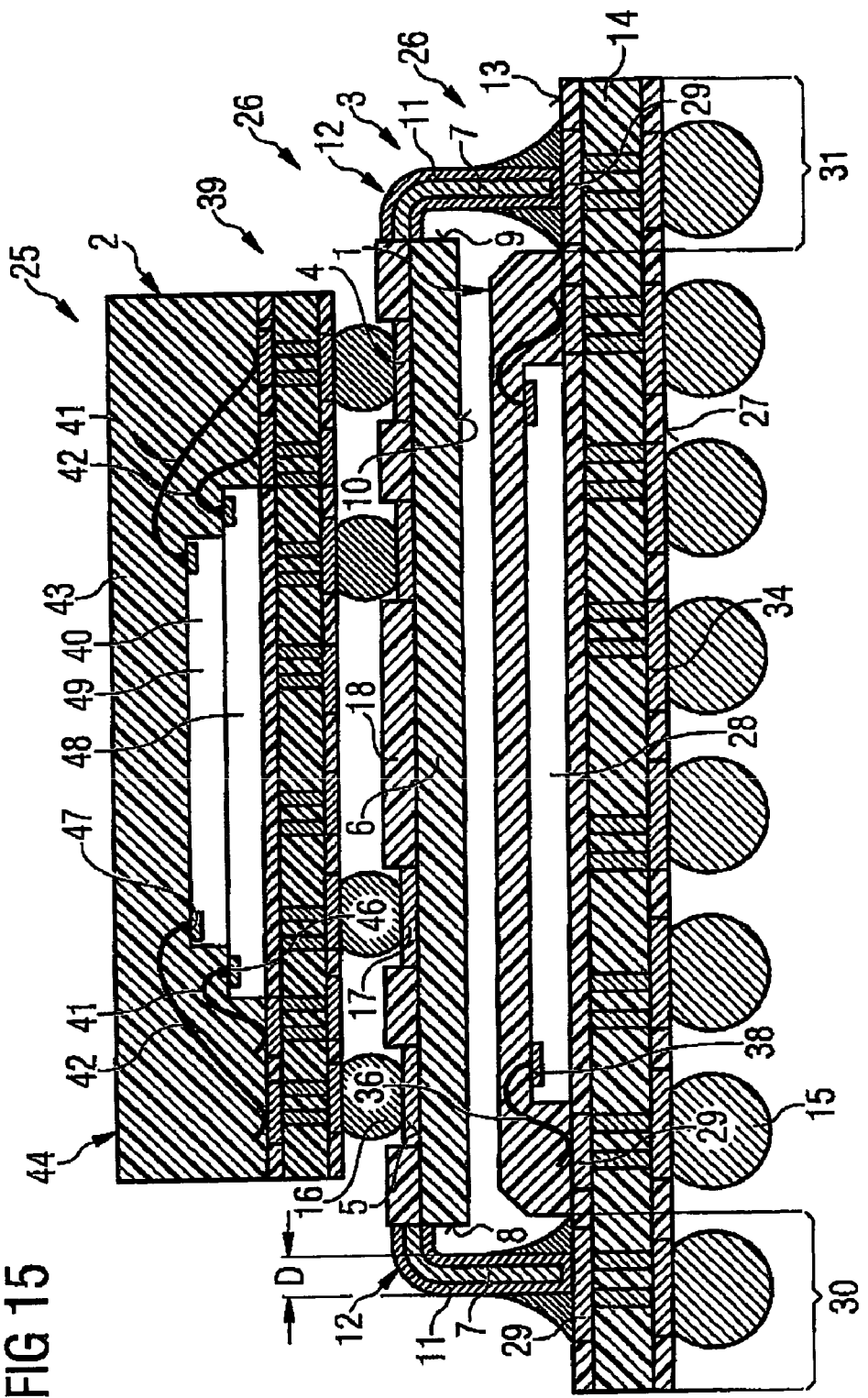
FIG. 15 shows a cross section through a semiconductor stack with a coupling substrate.

FIG. 15 shows a schematic cross section through a semiconductor stack 25 with a coupling substrate 3. The semiconductor stack 25 has a semiconductor base component 26 such as is already shown in FIG. 14, and a stacked semiconductor component 39 having an internal semiconductor chip stack 40 is arranged on the external contact areas 17 of the coupling substrate 3. The internal semiconductor chip stack 40 is connected to the external contacts 16 of the stacked semiconductor component 39 via bonding connections 41 and 42. The internal semiconductor chip stack 40 with the bonding connections 41 and 42 is embedded in a plastics composition 43 of a plastic housing 44. The coupling substrate 3 thus connects the contact areas 38, 46 and 47 of three semiconductor chips 28, 48 and 49, and enables mutual communication of the external contacts 16 of the stacked semiconductor component 39 as upper semiconductor component 2 of the semiconductor component stack 39 via external contact areas 17 of the coupling substrate 3 with external contacts 15 of the lower semiconductor component 1 via the flat conductor external contacts 12 of the coupling substrate 3.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A coupling substrate for a semiconductor component, comprising:
    an insulating carrier including lateral edges;
    a patterned metal layer disposed on a topside of the insulating carrier, the patterned metal layer comprising metal tracks that project beyond the lateral edges of the insulating carrier and are angled away from the topside toward an underside of the insulating carrier and project beyond the underside, wherein the metal tracks have insufficient thickness to operate as dimensionally-stable flat conductor external contacts; and
    a metal coating disposed on only portions of the metal tracks which extend beyond the lateral edges of the insulating carrier, a cross-sectional thickness of the metal coating and metal tracks being sufficient for the metal coating and metal tracks to operate as dimensionally-stable flat conductor external contacts of the coupling substrate that extend below the underside of the insulating carrier and that are capable of supporting the weight of the coupling substrate without substantially deforming.

2. The coupling substrate as claimed in claim 1, wherein the flat conductor external contacts are coupled to a semiconductor component and the flat conductor external contacts and the semiconductor component are arranged on a topside of a wiring substrate.

3. The coupling substrate as claimed in claim 1, wherein the coupling substrate comprises a wiring structure on the underside of the insulating carrier, the wiring structure carrying a semiconductor chip.

4. The coupling substrate as claimed in claim 1, wherein the flat conductor external contacts are coupled to a semiconductor chip having flip-chip contacts.

5. The coupling substrate as claimed in claim 1, wherein the flat conductor external contacts are coupled to a semiconductor component that includes surface-mountable external contacts.

6. A semiconductor module, comprising:
    a semiconductor base component comprising: a wiring substrate with external contacts of a semiconductor stack disposed on an underside of the wiring substrate and with a wiring structure with a semiconductor chip disposed on a topside of the wiring substrate and including contact pads on edge regions of the topside; and
    the coupling substrate of claim 1, further comprising external contact areas suitable for accommodating a stacked semiconductor component on a topside of the insulating carrier, and wherein the coupling substrate is connected via the flat conductor external contacts to the contact pads.

7. A semiconductor base component, comprising: the coupling substrate of claim 1, further comprising:

external contact areas on the topside of the insulating carrier for stacking a semiconductor component on the topside; and a wiring structure disposed on an underside of the coupling substrate, which is electrically connected to a semiconductor chip and is electrically connected to the external contact areas via through contacts and wiring lines.

8. The coupling substrate as claimed in claim 1, further comprising external contact areas on the topside of the insulating carrier, the external contact areas being surrounded by a soldering resist layer and including an arrangement pattern configured to be coupled to external contacts of a semiconductor component to be stacked.

9. The coupling substrate as claimed in claim 6, wherein the flat conductor external contacts of the coupling substrate are electrically connected to the external contact areas on the topside of the insulating carrier via conductor tracks of the patterned metal layer.

10. A coupling substrate strip, comprising:

a plurality of coupling substrate positions arranged in rows and/or columns on a topside of a common insulating carrier strip and comprising a patterned metal layer, metal tracks of the patterned metal layer partly extending via passage openings of the insulating carrier strip in lateral regions of the coupling substrate positions and being angled away from the topside of the carrier strip toward an underside of the carrier strip and projecting beyond the underside, the metal tracks comprising a metal coating, a cross-sectional thickness of the metal coating and metal tracks being sufficient for the metal coating and metal tracks to operate as dimensionally-stable flat conductor external contacts of the coupling substrate strip at the lateral edges of the coupling substrate positions, wherein only portions of the metal tracks which project beyond lateral edges of the insulating carrier strip are reinforced with the metal coating, and wherein the passage openings are arranged between the coupling substrate positions in a common plane;

external contact areas disposed on the topside in the coupling substrate positions, which are surrounded by a soldering resist layer; and an arrangement pattern for external contacts of a semiconductor component to be stacked.

11. The coupling substrate strip as claimed in claim 10, wherein the flat conductor external contacts are connected to the external contact areas on the topside of the insulating carrier strip via conductor tracks of the patterned metal layer.

12. The coupling substrate strip as claimed in claim 10, wherein the coupling substrate strip further comprises wiring structures on the underside of the insulating carrier strip in the coupling substrate positions, the wiring structures accommodating semiconductor chips.

13. The coupling substrate strip as claimed in claim 10, further comprising semiconductor components that include surface-mountable external contacts disposed on the underside in the coupling substrate positions.

14. The coupling substrate strip as claimed in claim 10, wherein the coupling substrate strip further comprises semiconductor chips that include flip-chip contacts disposed on the underside in the coupling substrate positions.

* * * * *